United States Patent
Cardwell

(10) Patent No.: US 10,319,620 B2
(45) Date of Patent: Jun. 11, 2019

(54) COMMON PROCEDURE OF INTERCONNECTING ELECTRONIC CHIP WITH CONNECTOR BODY AND FORMING THE CONNECTOR BODY

(71) Applicant: Infineon Technologies AG, Neubiberg (DE)

(72) Inventor: Stuart Cardwell, Crowborough (GB)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/849,801

(22) Filed: Dec. 21, 2017

(65) Prior Publication Data

US 2018/0182651 A1 Jun. 28, 2018

(30) Foreign Application Priority Data

Dec. 22, 2016 (DE) .................. 10 2016 125 521

(51) Int. Cl.
*H01L 21/60* (2006.01)
*H01L 21/67* (2006.01)
*H01R 13/436* (2006.01)
*H01L 21/48* (2006.01)
*H01L 21/56* (2006.01)
*H01L 23/00* (2006.01)
*H01L 21/768* (2006.01)
*H01L 21/477* (2006.01)

(52) U.S. Cl.
CPC .... *H01L 21/67144* (2013.01); *H01L 21/4846* (2013.01); *H01L 21/563* (2013.01); *H01L 21/76898* (2013.01); *H01L 24/73* (2013.01); *H01R 13/4365* (2013.01); *H01L 21/477* (2013.01); *H01L 21/4842* (2013.01); *H01L 21/4878* (2013.01); *H01L 2924/14* (2013.01)

(58) Field of Classification Search
CPC ............ H01L 21/4842; H01L 21/4878; H01L 2021/603; H01L 21/67144; H01L 21/477; H01L 23/495541
USPC ......................................... 29/25.01; 438/123
See application file for complete search history.

(56) References Cited

U.S. PATENT DOCUMENTS

| 3,724,068 | A |   | 4/1973  | Galli   |                  |
|-----------|---|---|---------|---------|------------------|
| 3,864,728 | A | * | 2/1975  | Peltz   | ...... H01L 21/67144 |
|           |   |   |         |         | 257/677          |
| 4,585,157 | A | * | 4/1986  | Belcher | ......... B23K 3/04 |
|           |   |   |         |         | 228/180.21       |
| 5,232,532 | A | * | 8/1993  | Hori    | ........ H01L 21/563 |
|           |   |   |         |         | 156/163          |
| 6,121,674 | A | * | 9/2000  | Corisis | ....... H01L 23/49503 |
|           |   |   |         |         | 257/666          |
| 6,329,706 | B1| * | 12/2001 | Nam     | ......... H01L 23/49503 |
|           |   |   |         |         | 257/666          |
| 6,402,009 | B1| * | 6/2002  | Ishikawa| ......... H01L 21/4878 |
|           |   |   |         |         | 228/173.1        |

(Continued)

FOREIGN PATENT DOCUMENTS

DE          10124770 C1    10/2002
DE        102007057346 B3   6/2009

(Continued)

*Primary Examiner* — George R Fourson, III

(57) ABSTRACT

A method which comprises applying a common pressing force operative to interconnect an electronic chip with a connector body by an interconnect structure, and to contribute to a forming of the connector body.

22 Claims, 6 Drawing Sheets

(56) References Cited

U.S. PATENT DOCUMENTS

| | | | | |
|---|---|---|---|---|
| 6,864,423 B2* | 3/2005 | Tan | .................... | H01L 21/4842 |
| | | | | 174/536 |
| 6,903,920 B1* | 6/2005 | Prymak | ................. | H01G 2/065 |
| | | | | 361/306.1 |
| 2004/0217470 A1* | 11/2004 | Takano | ............... | H01L 21/4842 |
| | | | | 257/734 |
| 2008/0122048 A1* | 5/2008 | Chan | .................. | H01L 21/4842 |
| | | | | 257/666 |
| 2009/0179315 A1* | 7/2009 | Jereza | .................. | H01L 21/565 |
| | | | | 257/676 |
| 2010/0127366 A1* | 5/2010 | Bond | ................. | G06K 9/00026 |
| | | | | 257/676 |
| 2012/0011914 A1* | 1/2012 | Kumamoto | ......... | H01L 21/4842 |
| | | | | 72/312 |
| 2012/0266434 A1* | 10/2012 | Yu | ........................ | H05K 1/0281 |
| | | | | 29/428 |
| 2014/0210062 A1* | 7/2014 | Miyazaki | .......... | H01L 23/49541 |
| | | | | 257/676 |
| 2014/0293565 A1* | 10/2014 | Kondo | ................ | H01L 23/3185 |
| | | | | 361/767 |
| 2016/0148819 A1* | 5/2016 | Heuck | ................ | H01L 21/4825 |
| | | | | 438/121 |
| 2018/0182651 A1* | 6/2018 | Cardwell | .......... | H01L 21/67144 |

FOREIGN PATENT DOCUMENTS

| | | | |
|---|---|---|---|
| DE | 102009017853 A1 | 11/2009 | |
| DE | 102010037439 A1 | 4/2011 | |
| DE | 112014004403 T5 | 7/2016 | |
| EP | 0694871 A1 | 1/1996 | |

\* cited by examiner

COMMON PROCEDURE OF INTERCONNECTING ELECTRONIC CHIP WITH CONNECTOR BODY AND FORMING THE CONNECTOR BODY

BACKGROUND OF THE INVENTION

Field of the Invention

The present invention relates to a method and an apparatus.

Description of the Related Art

A power module, for instance for automotive applications, provides a physical containment for power components, usually power semiconductor devices in form of electronic chips comprising one or more integrated circuit components. Examples of integrated circuit components of power modules are a metal oxide semiconductor field effect transistor (MOSFET), an insulated-gate bipolar transistor (IGBT), and a diode.

For packages with electronic functionality, it is a necessity to manufacture the packages with reasonable effort.

SUMMARY OF THE INVENTION

There may be a need for a system of efficiently processing chips and connector bodies.

According to an exemplary embodiment, a method is provided which comprises applying a common pressing force being operative to interconnect an electronic chip with a connector body by an interconnect structure, and to contribute to a forming (or shaping) of the connector body.

According to another exemplary embodiment, an apparatus is provided which comprises a pressing unit configured to apply pressure to an electronic chip on an interconnect structure on a mounting portion of a connector body and to a forming portion (or shaping portion) of the connector body (i.e. a portion of the connector body to be formed or shaped), and a control unit configured for controlling the pressing unit to (in particular at least partially simultaneously or temporally overlapping) mount the electronic chip on the connector body by the interconnect structure and to form (or shape) the connector body by a pressing force which is at least partly maintained during both mounting and forming.

According to an exemplary embodiment of the invention, the two processes of interconnecting an electronic chip with a connector body by an interconnect structure on the one hand and forming the connector body (for instance into a three-dimensionally curved shape) may be carried out combinedly, sharing at least partly the same pressing force being applied during both procedures. This means that the procedure of mounting the electronic chip on the connector body via the interconnect structure may be supported by the application of a pressing force pressing the electronic chip and the connector body together, thereby promoting formation of a strong bond or interconnection between the electronic chip and the connector body by the interconnect structure in between. Advantageously, this pressing force used for the interconnection can be maintained fully or partly until a shaping or reforming procedure of changing the shape of the connector body is completed. Such a forming procedure can for instance be carried out by maintaining said pressure between electronic chip and connector body, if desired or required by additionally applying a further pressing force to the connector body only for the sole purpose of forming, so that the combined pressing forces may act on the connector body in a way that its shape is changed. By taking this measure, the formation of the interconnection and the formation of a (for instance three-dimensionally curved) connector body with definable shape can be synergetically combined to a common procedure. This saves time, simplifies the manufacturing process and reduces the complexity of the apparatus carrying out such procedures. Furthermore, the possibility of forming the connector body after mounting the electronic chip increases the freedom of design in terms of applying the interconnect structure to the connector body as long as it in an appropriate shape for this purpose. In an embodiment, part of the pressing force used for the mounting also contributes to the forming. By taking this measure, a combined interconnection and forming procedure may be carried out which is quick, reliable and resource-saving.

DESCRIPTION OF FURTHER EXEMPLARY EMBODIMENTS

In the following, further exemplary embodiments of the apparatus and the method will be explained.

A gist of an exemplary embodiment is that, when the forming procedure forms a chip accommodating cavity in a previously flat or planar connector body, it is possible to apply (for instance by stencilling) the interconnect structure onto a still planar connector body. This is a very simple and quick procedure which would involve significantly higher effort when being carried out on a connector body already having a cavity at the time of applying the interconnect structure. Forming the cavity after the application of the interconnect structure and after interconnection of the electronic chip by the interconnect structure allows to significantly reduce the overall manufacturing effort.

In the context of the present application, the term "electronic chip" may particularly denote an electronic component such as a semiconductor chip. In terms of packaging, the semiconductor chip needs to be mounted on a chip carrier, for instance the connector body. For example, the electronic chip may be a power semiconductor chip and may implement one or more electronic functions such as that of a diode, a transistor, etc. It is possible to provide one or multiple electronic chips per connector body.

In the context of the present application, the term "connector body" may particularly denote a body on which an electronic chip is to be mounted (for instance when the connector body is a chip carrier) or which is to be mounted on an electronic chip (for instance when the connector body is a clip). The connector body may serve as a mechanical support and/or may contribute to the electric connection of the electronic chip. In various embodiments, the connector body may be a leadframe, an IMS, a printed circuit board (PCB), an interposer, etc. The connector body may be partly or entirely made of a stiff material which can however be formed or reshaped under certain conditions, for instance the simultaneous application of heat and pressure, or the mere application of pressure.

In the context of the present application, the term "interconnect structure" may particularly denote an interface between the electronic chip and the connector body. In one embodiment, the interconnect structure may be an interconnect material such as a sinterable material or a solderable material. In such an embodiment, melting of this interconnection material may establish the interconnection between the electronic chip and the connector body. However, in other exemplary embodiments, the interconnect structure may be free of a separate material and may simply denote a region of the connector body at which the formation of the interconnection occurs. For instance, such a material free interconnect structure may be the formation of a welding connection between electronic chip and connector body.

In the context of the present application, the term "forming the connector body" may particularly denote changing the exterior shape of the connector body at least locally at and/or around a position where a pressure is applied. Such a forming may be a bending by another type of modification of the material position of different portions of the connector body relative to one another.

In the context of the present application, the term "pressing" may particularly denote the application of a mechanical force onto dedicated portions of the electronic chips and/or the connector body. Such an application of pressure may be accomplished by one or more pressing bodies which may contact a pressed surface of the electronic chip and/or the connector body. Such one or more pressing bodies may be pushed against the respective surface to apply the pressure.

In the context of the present application, the term "control unit" may particularly denote a controlling entity which controls the above-described process and which coordinates various units contributing to the execution of this method, for instance based on an algorithm stored in a computer readable medium of or accessed by the control unit. For example, the control unit may be a processor or an array of processors or part of a processor. Such a processor may be a microprocessor, a central processing unit (CPU), a computer, etc.

In an embodiment, the interconnect structure is a sinter material, for instance a silver sinter paste. Therefore, the interconnection between electronic chip and connector body may be accomplished by sintering. A sinter material may be a powderous material, optionally covered by a coating, which becomes sticky in the event of applying pressure, optionally in combination with heat. A result is the formation of a sinter structure which strongly interconnects electronic chip and connector body. Since the process of sintering involves the application of pressure, it can be properly combined with the process of forming the connector body, which can be done by applying pressure as well. Hence, a corresponding interconnection procedure may involve the application of mechanical pressure supported by heat.

In another embodiment, the interconnect structure is a solder material, in particular a diffusion-solder material. A corresponding interconnection procedure may also involve the application of mechanical pressure supported by heat.

Solder-sinter processes may be involved as well according to exemplary embodiments to obtain a thermally and mechanically reliable connection.

In an embodiment, the connector body comprises or consists of a chip carrier such as a leadframe. The term "leadframe" may particularly denote an electrically conductive structure, in particular made of copper, which can carry an electronic chip and which can also accomplish a desired electric connection. In the context of the described method, the connector body may initially be a planar metal sheet which is connected to one or more electronic chips and which is brought into a modified (for instance three-dimensional) shape.

However, it is also possible that the connector body comprises or consists of a clip. Such a clip may be configured to electrically connect (in particular also to clamp) the electronic chip onto another body (such as a chip carrier). In an embodiment, a clip to be connected to the electronic chip by pressing and heating during the mounting may also be bent or re-shaped during the pressing and heating In an embodiment, prior to the forming, the connector body is a planar structure, in particular a planar metal sheet.

After the forming, the connector body may have been converted into a three-dimensionally bent structure, in particular a curved metal sheet. In the described embodiment, mounting of the electronic chip on the connector body may be carried out based on a simple and easy to handle metal plate such as a copper plate. Thus, a very simple semifinished product may be used which is brought into a desired shape during the combined process of chip mounting and carrier bending.

In an embodiment, a plurality of electronic chips are mounted on different mounting portions of the connector body (such as a metal sheet or a leadframe) by different interconnect structures by the simultaneous application of pressure to all electronic chips and all said mounting portions of the connector body. Therefore, the described procedure is properly compatible with a batch manufacturing of multiple sections (such as packages or modules), each having a part of the connector body and at least one electronic chip mounted on this part. An array of pressing bodies may press the various electronic chips onto the various interconnect structures on the various portions of the common or integral connector body, before further pressing the different portions of the connector body into corresponding shapes. Such a concept allows to manufacture multiple packages in an economic, quick way without excessive effort.

In an embodiment, after the forming and the mounting, the connector body with the electronic chips mounted thereon by the interconnect structures is singularized into multiple sections, each section comprising a portion of the connector body, at least one of the electronic chips and at least one of the interconnect structures. The singularization may be carried out by cutting the reshaped, reformed or bent connector body into various portions, for example mechanically or by laser. Thereby, a plurality of in particular identical sections are obtained each of which containing a portion of the connector body and at least one of the electronic chips. To complete formation of a package or module, the section may either be used as such, or may be made subject to a further electric connection (for instance formations of bond wires or bond ribbons) and/or encapsulation by an encapsulant such as a mold compound. Encapsulation may however also be omitted, for instance when the formed connector body defines a cavity in which the electronic chip is accommodated. The described batch manufacture allows to manufacture packages or modules in a fast and simple way.

In another embodiment, a plurality of electronic chips are mounted on different ones of multiple separate connector bodies by different interconnect structures by the simultaneous application of pressure to all electronic chips and all connector bodies. For instance, multiple separate flat metal sheets with an interconnect structure thereon may be equipped with an electronic chip (as the mounting) and may then be individually re-shaped (as the forming).

In an embodiment, the method further comprises heating the electronic chip, the interconnect structure and the connector body to an elevated temperature above ambient temperature (for example 300 K) during the mounting and the forming. The heating may be made up to a temperature corresponding to at least to an interconnect temperature (such as a sinter temperature) at which the interconnect structure interconnects the electronic chip with the connector body. In another embodiment, the heating may be made up to a temperature of at least 200° C. Correspondingly, the apparatus may comprise a tempering unit configured for heating the electronic chip, the interconnect structure and the connector body (for instance indirectly by directly heating pressing bodies applying pressure and conducting heat to electronic chip, interconnect structure and connector body) at least to an interconnection temperature at which interconnection of the electronic chip and the connector body by the interconnect structure is triggered, in particular at least 200° C. In certain embodiments, the process of interconnection requires the supply of heat to the interface between electronic chip and connector body. This is for instance the case for sintering, soldering or welding. In the case of sintering, it is required to heat the interface between electronic chip and connector body, i.e. the interconnect structure, to a temperature at or above a sintering temperature. When pressure is then applied between electronic chip and connector body, the sinter connection is formed. This shows that the process of interconnection may be advantageously promoted by the addition of heat. The anyway provided heat (corresponding to an elevated temperature to which the electronic chip and the connector body are brought for interconnection) may be maintained also for the process of forming the connector body with low additional effort. This has the advantage that the material of the connector body can be made softer at higher temperatures than at lower temperatures. Thereby, making the connector body temporarily softer by the temporary supply of heat also simplifies the forming or bending procedure which is possible at elevated temperature with less additional pressure. Consequently, the elevated temperature required for the interconnection anyway may be synergistically used for the forming, which can therefore be accomplished in a quick, simple and energy-efficient way.

In another embodiment, the method further comprises heating the electronic chip, the interconnect structure and the connector body at least to an interconnect temperature at which the interconnect structure interconnects the electronic chip with the connector body during the mounting, and is configured for subsequently further heating the electronic chip, the interconnect structure and the connector body to a further elevated temperature for forming. After completion of the interconnection, a re-melting temperature of the (for instance chemically modified) interconnect structure (which now may be sort of an alloy of interconnection material intermingled with adjacent material of the connector body) may be higher than an original interconnection temperature (for instance sintering temperature) of the interconnection material. Therefore, it is possible to further increase the temperature during forming without the risk of re-melting of the already established interconnection. This additional temperature increase may render the material of the connector body to be formed softer and even better bendable without involving the danger of an undesired re-melting of the interconnection between electronic chip and the connector body. The additional temperature increase should however be sufficiently moderate to not harm the (for instance silicon) material of the electronic chip. For instance, the temperature during interconnecting may be in a range between 150° C. and 400° C., whereas the temperature during forming may be between 50° C. and 300° C. higher than the temperature during interconnecting.

The mentioned tempering unit may be a heating unit capable of supplying a defined amount of heat to the electronic chip, the connector body and/or the interconnect structure, wherein this heat may be used for the process of interconnecting and/or forming. For instance, the supplied heat may be ohmic heat by an electric conductor with high electric resistance through which an electric current flows. It is also possible to heat by a heating fluid, an irradiation with electromagnetic radiation, etc.

In an embodiment, the interconnect structure is applied on the connector body prior to the mounting and the forming. In such an embodiment, the interconnect structure is embodied as a separate interconnect material, as used for sintering or soldering. Application of the interconnection material to one or more dedicated portions of a connector body may be accomplished simply by stencilling, dispensing, printing, spraying, sputtering, etc. Therefore, in particular in a batch procedure (for instance processing 20 to 100 devices or electronic chips at the same time), the connector body or a raw form thereof may be provided with spots of interconnection material so that the subsequent formation of interconnections may be simply accomplished by mounting the various electronic chips thereon and connecting them by the application of pressure, if desired in combination with heat.

In an embodiment, the method comprises applying pressure between the electronic chip and a mounting portion of the connector body by at least one first pressing body and, before releasing the pressure applied by the at least one first pressing body, applying pressure on a forming portion the connector body by at least one second pressing body for forming. In such an embodiment, the one or more first pressing bodies may press the connector body and the electronic chip together from two opposing sides during the interconnection. For example, this may be done by two cooperating pressing bodies one of which applying pressure to an upper or exposed surface of the electronic chip and another one applying a counter-pressure (i.e. in an antiparallel direction) for pressing a lower surface of the connector body against the electronic chip. While the at least one first pressing body contributes to both the chip mounting and the forming, the one or more second pressing bodies may function for example only in terms of forming or bending, hereby cooperating with the one or more first pressing bodies. While the pressure applied by the one or more first pressing bodies is still maintained, the one or more second pressing bodies may apply pressure to portions of the connector body adjacent to the mounting position of the electronic chips. For instance, such second pressing bodies may apply pressure to such neighbouring portions of the connector body from both opposing main surfaces of the connector body to precisely define the modified shape of the connector body.

In an embodiment, the method comprises releasing the pressure applied by the at least one first pressing body and by the at least one second pressing body after the mounting and the forming, so that the electronic chip is mounted on the formed connector body by the interconnect structure. Such a procedure allows a simple handling of the involved components, because the pressure of the one or more first pressing bodies may be simply applied between connector body and chip during both interconnection and forming, whereas the one or more second pressing bodies need to be moved only for the process of forming. This allows a very simple handling of the pressing bodies in terms of interconnection and forming.

In an embodiment, the forming procedure forms a cavity (which may also be denoted as can) in the connector body in which the interconnect structure and the electronic chip are located or accommodated at least partially. Such a cavity may be denoted as a recess in the connector body forming a dip or indentation into which the electronic chip may be put. Such a cavity may be simply formed by first pressing bodies pressing onto the electronic chip and the connector body at the interconnection position in combination with second pressing bodies lowering the section of the connector body on which the electronic chip is mounted with regard to a surrounding portion of the connector body (see FIG. 8).

In an embodiment, the forming procedure forms a frame (which can be any three-dimensionally formed structure of the connector body) surrounding the electronic chip and the interconnect structure. A frame may be a portion of the connector body surrounding the electronic chip and providing mechanical support.

In an embodiment, the mounting simultaneously attaches the electronic chip to a clip. Such a clip may for instance be substantially S-shaped or L-shaped (such a form may be designed by pressing bodies). As an alternative to the use of bond wires or bond ribbons, a clip may accomplish an electric connection between an upper main surface of an electronic chip and the connector body. The clip may therefore be a three-dimensionally bent and preferably electrically conductive structure connecting the upper main surface of the electronic chip with the connector body and having a bent formation. Connecting the clip to the electronic chip may be accomplished by sandwiching the chip contacting portion of the clip between the electronic chip and the above-mentioned first pressing body. The carrier contacting portion of the clip may be clamped between the one or more second clamping bodies on the one hand and the connector body on the other hand. Therefore, the described sinter form architecture is properly compatible with a connection technology between electronic chip and connector body using a clip.

In an embodiment, during the forming, at least one lead electrically contacting the electronic chip is attached to the electronic chip and/or formed as part of the connector body. Such leads may for instance be supply pins supplying electric power to the electronic chip and/or signal pins transporting electric signals between the electronic chip and an electronic environment. Such leads may for instance be separate portions of a leadframe, for instance of a leadframe constituting the connector body or of a further separate leadframe. For certain applications, leads may be bent into a desired configuration. Bending leads may be accomplished by the second pressing bodies as part of the forming or bending procedure of the connector body.

In an embodiment, the control unit is configured for controlling the tempering unit to maintain the connector body, the electronic chip and the interconnect structure at least at the interconnect temperature during mounting and forming. If desired, it is also possible that the control unit controls the tempering unit to reduce or further increase the supplied energy for the forming, depending on the circumstances of a specific application. It is possible that the tempering unit unspecifically provides the heating energy to the entire arrangement composed of electronic chip, connector body and interconnect structure, or specifically only to certain portions (for instance the interconnect structure and a bending portion of the connector body).

In an embodiment, the control unit is configured for controlling the apparatus to carry out a method having the above mentioned features. For that purpose, the control unit may be correspondingly programmed or may execute executable program code. Thus, algorithms in connection with the above-described processes of the method may be implemented in a computer-readable medium which the control unit may comprise or access in terms of the execution of the method.

In an embodiment, the manufactured device (which may comprise connector body and electronic chip) is configured as a converter, in particular a DC-DC converter. Such a converter may be configured for converting a battery voltage into a supply voltage for an electric engine, or in opposite direction.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc. However, the manufactured package or device may also be used for other applications, such as industrial applications (for instance an air condition) or consumer applications (for instance for a computer or a vacuum cleaner).

In an embodiment, the manufacturing method may accommodate the electronic chip in a can or cavity of the formed connector body. Such a packaging architecture may hence be free of a molding (or other kind of encapsulation) procedure. This reduces the manufacturing effort and allows to obtain a lightweight and compact device.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
FIG. 1 to FIG. 10 show cross-sectional views of a device under manufacture and of an apparatus for processing an electronic chip, to be mounted by sintering, and a connector body, to be formed during the mounting procedure, according to an exemplary embodiment of the invention.

The illustration in the drawing is schematically.

Before describing further exemplary embodiments in further detail, some basic considerations of the present invention will be summarized based on which exemplary embodiments have been developed.

According to an exemplary embodiment, the processes of sintering an electronic chip on a connector body and of forming (or re-forming or shaping or bending) the connector body are carried out in a common procedure. Taking this measure in particular enables batch sintering of electronic chips or dies onto connector bodies such as leadframes that ultimately have a form which would ordinarily not allow the sinter process to take place. An exemplary embodiment of the invention thus brings together two processes, i.e. sintering (or more generally interconnecting or mounting) and forming.

According to an exemplary embodiment, one or more electronic chips is or are placed onto sinter paste which has been stenciled onto a flat connector body such as a leadframe. Then, during the sintering process once the bond has been made but before release of pressing bodies of a sinter press, dynamic inserts or the like may come down to form the connector body into a can shape. Such a process can be made easier, because the connector body is at an elevated sinter temperature (of for example at least 250° C.). This makes the connector body, for instance a copper leadframe, more pliable and easier to form, generating less stress which may ordinarily affect the die-attach joint.

In an embodiment, the described process can be used to form any frame around a die. In yet another embodiment, it can be used for attaching die to clips, or for attaching and forming leads to a die.

In an embodiment, both sinter presses and forming machines can be advantageously incorporated into one machine. By taking this measure, it is possible to streamline two processes, namely the sinter joint die attach, and the connector body (for instance frame and/or can) forming process, into one single (for instance batch) process. Such an architecture may significantly enhance the thermal and electrical performance of the manufactured device (such as a package or module). According to an exemplary embodiment of the invention, a manufacturing process for packages or modules is provided. In contrast to existing solutions, exemplary embodiments of the invention may realize a quick batch process which can be carried out with low effort.

More specifically, a preform of a connector body, for instance embodied as a flat frame, may be provided with sinter paste screened on (for instance B-Stage cure of sinter paste). Subsequently, a die or electronic chip may be placed on the sinterable material or any other interconnect structure. Then, a combined sinter-press and forming process may be carried out, wherein the leadframe (or other kind of connector body), the die and the sinter paste are brought up to a sintering temperature (or higher, if necessary or desired). Thus, there may be then a combined process of compressing the sinter joint and then forming of the connector body around the die. For instance, this may render it possible to establish drain connections to the same plane as the source side of the die, when the latter comprises an integrated field effect transistor. This allows to effectively form a can around the die. In an embodiment, singulation does not yet take place at this point as the devices would need to be bumped in frame and reflowed. It may be preferred that the sinter joint is created first or during the initial stages of the forming process. This may allow the die and sinter joint to deform along with the can when it is formed by bow or warpage introduced.

If the sinter joint has not been fully formed, then the bondline thickness may be affected as the die resists the warpage and the un-sintered (for instance silver) sinter material deforms to accommodate the two dissimilar places of the flat die and warped can.

FIG. 1 to FIG. 10 show cross-sectional views of arrangements obtained during manufacture of a device 135 under manufacture by an apparatus 130. The apparatus 130 is hereby configured for processing an electronic chip 100, to be mounted by sintering, and a connector body 102, to be formed during the mounting procedure, according to an exemplary embodiment of the invention. In a nutshell, the method comprises applying a common pressing force operative to interconnect the electronic chip 100 with the connector body 102 by an interconnect structure 104, and to contribute to a forming of the connector body 102.

Referring to FIG. 1, the connector body 102 is provided in form of a planar metal plate, for instance copper plate, and is thereby embodied as a leadframe or other type of chip carrier under manufacture. Hence, prior to a forming procedure described referring to FIG. 4 to FIG. 10, the connector body 102 is a planar structure 110 configured as a metal sheet. Thus, the starting point of the described method is a cheap and simply manufacturable connector body 102.

Figure 2:
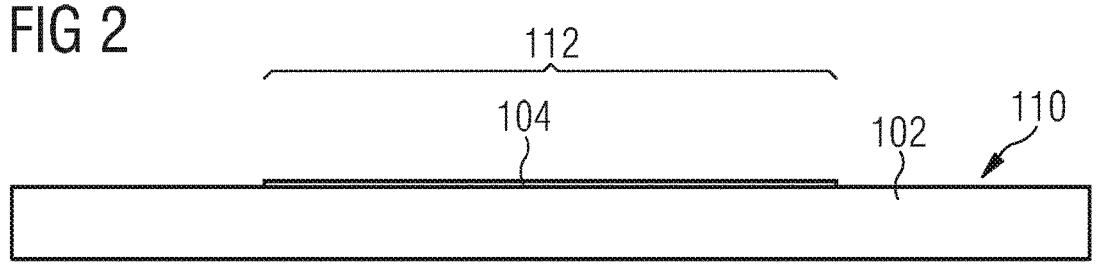

Referring to FIG. 2, the interconnect structure 104 is applied on a surface portion of the connector body 102 prior to the chip mounting and the carrier forming procedure. In the shown embodiment, the interconnect structure 104 is a sinter material applied as a thin layer on a mounting region 112 of the connector body 102. The mounting region 112 will later be the surface portion of the connector body 102 on which the electronic chip 100 will be subsequently mounted. Referring to FIG. 2, a sinter paste is applied as interconnect structure 104 onto the mounting portion 112 of the connector body 102. Application of the sinter paste may be carried out by stencilling or the like.

Figure 3:

Referring to FIG. 3, the electronic chip 100 is placed on the previously applied interconnect structure 104 on the connector body 102. The electronic chip 100 may for instance be a semiconductor power chip and may comprise at least one integrated circuit element such as a field effect transistor (FET). FIG. 3 shows the result of a procedure of die attachment, i.e. attaching the electronic chip 100 onto the interconnect structure 104 on the connector body 102. This procedure may be accomplished by a pick-and-place assembly.

Figure 4:
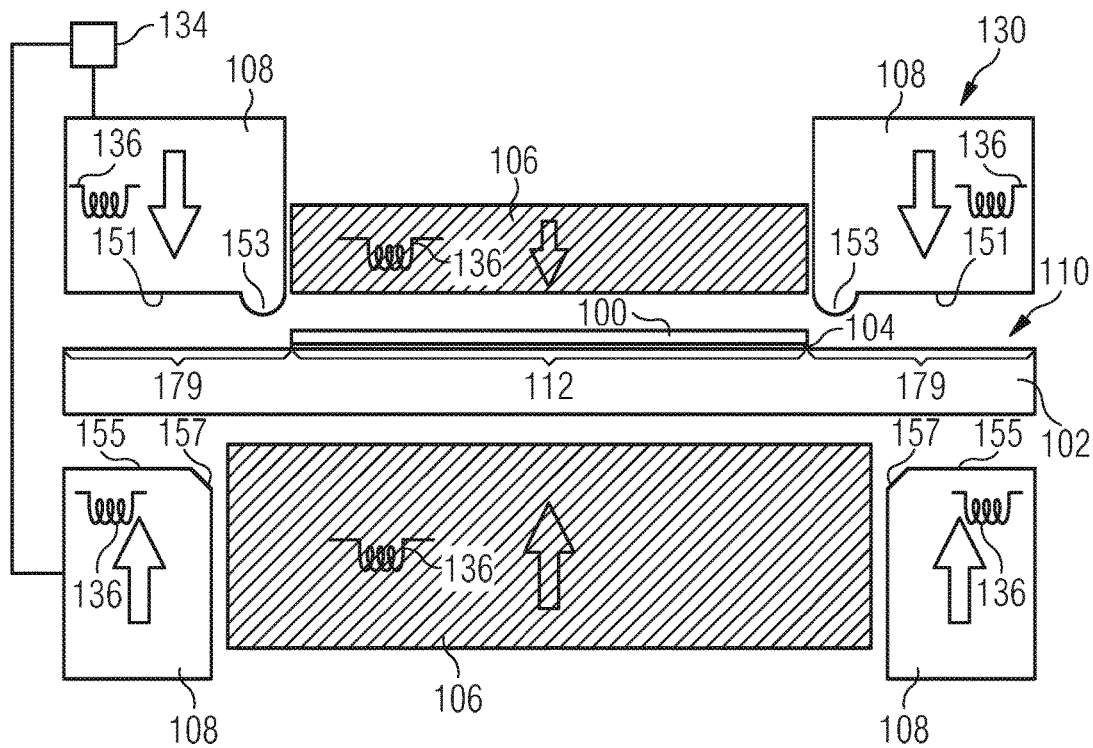

Referring to FIG. 4, components of the apparatus 130 for accomplishing a common chip mounting and carrier forming procedure according to an exemplary embodiment of the invention are shown. The apparatus 130 comprises a pressing unit 106, 108 configured to apply pressure to the electronic chip 100 on the interconnect structure 104 on the mounting portion 112 of the connector body 102 and to a forming portion 179 of the connector body 102 (for the sake of simplicity only shown in FIG. 4). The forming portion 179 of the connector body 102 is a portion thereof which will be made subject to a forming or bending process by pressure applied by the pressing unit 106, 108. More specifically, sinter press or pressing unit 106, 108 is composed of first pressing bodies 106 and second pressing bodies 108. They cooperate and are configured to apply pressure to the electronic chip 100 and to the connector body 102. A control unit 134 of the apparatus 130 may be embodied as one or more processors (for instance a microprocessor or a central processing unit, CPU). The control unit 134 may be configured for controlling the pressing unit 106, 108 to mount the electronic chip 100 on the connector body 102 by the interconnect structure 104 and to form the connector body 102 by a commonly used pressing force which is effective during mounting and forming. More generally, the control unit 134 is configured for controlling the apparatus 130 to carry out the method described referring to FIG. 1 to FIG. 10, for instance on the basis of a programmed algorithm. Furthermore, the apparatus 130 comprises a tempering unit 136 (for the sake of simplicity only shown schematically in FIG. 4), for instance a controllable heater. The tempering unit 136 is configured for heating the electronic chip 100, the interconnect structure 104 and the connector body 102 during mounting at least to an interconnection temperature at which interconnection of the electronic chip 100 and the connector body 102 by the interconnect structure 104 is carried out (for instance 200° C.). More specifically, the control unit 134 may be configured for controlling the tempering unit 136 to maintain the connector body 102, the electronic chip 100 and the interconnect structure 104 at least at the interconnect temperature during mounting and forming. The already mentioned first pressing bodies 106 are configured for pressing the electronic chip 100 on the connector body 102 for mounting. The mentioned second pressing bodies 108 are configured to apply a pressing force to the connector body 102 for forming before releasing the pressure applied by the first pressing bodies 106.

In the procedure described in the following referring to FIG. 4 to FIG. 10, a pressing force is applied by the pressing unit 106, 108 under control of the control unit 134 to thereby interconnect the electronic chip 100 with the connector body 102 by the interconnect structure 104 and form the connector body 102 while the pressing force is at least partly maintained. Thus, pressure is applied between the electronic chip 100 and the mounting portion 112 of the connector body 102 by the first pressing bodies 106. Before releasing the pressure applied by the first pressing bodies 106 in terms of mounting, pressure is applied on the forming portions 179 the connector body 102 by the second pressing bodies 108 for forming or shaping the connector body 102. In this context, the tempering unit 136, operating under control of the control unit 134 as well, may keep the electronic chip 100, the interconnect structure 104 and the connector body 102 at least at the interconnection temperature also during forming or shaping the connector body 102. In the framework of this procedure, pressure is applied between the electronic chip 100 and the connector body 102 by the first pressing bodies 106 and, before releasing the pressure applied by the first pressing bodies 106, pressure is applied on the connector body 102 by the second pressing bodies 108 for forming. As a consequence, part of the pressing force used for the mounting also contributes to the forming.

As can be taken from FIG. 4, a compression and heating procedure is combined using a sinter press. In this context, two cooperating first heating bodies 106 clamp or press an arrangement of the electronic chip 100, the interconnect structure 104 and the connector body 102 together. During this clamping or pressing procedure for establishing a sinter connection between the electronic chip 100 and the connector body 102 by the interconnect structure 104 (here a sinterable material), the electronic chip 100, interconnect structure 104 and connector body 102 are heated by heating the first pressing bodies 106. This heating may be carried out by the tempering unit 136, controlled by the control unit 134.

Figure 5:
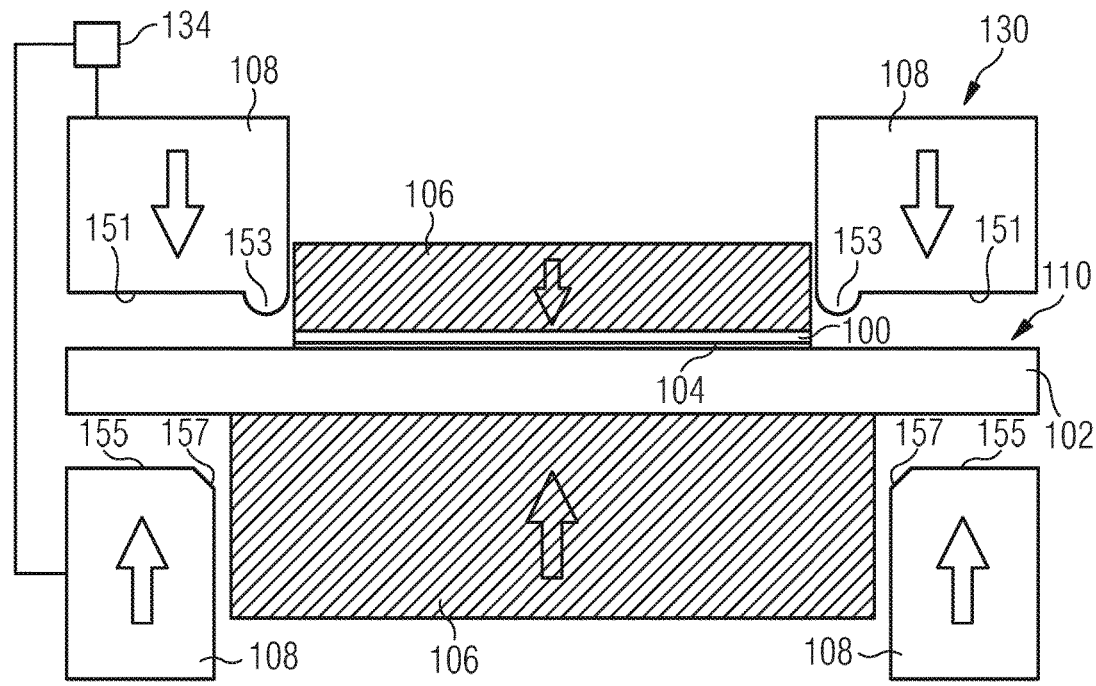

FIG. 5 shows how the actual sinter joint is formed due to the pressing and heating acting of the first pressing bodies 106.

The already shown second pressing bodies 108 are still inactive at the present stage of the method. The second pressing bodies 108 will now start to move to prepare a subsequent forming or reshaping procedure of forming or reshaping the connector body 102. During this procedure, the operation of the first pressing bodies 106 remains unchanged, so that they continuously press or clamp the arrangement of connector body 102, interconnect structure 104 and electronic chip 100 together and heating them. The second pressing bodies, which function as dynamic press tool, now move to form the copper frame, i.e. the connector body 102.

More specifically, FIG. 5 shows that a first set of the second pressing bodies 108 moves from an upper side downwardly, whereas a second set of the second pressing bodies 108 moves from a lower side upwardly. As can be taken from FIG. 5, the first set of second pressing bodies 108 has a flat surface 151 and a protruding section 153, the latter accomplishing a clamping of the connector body 102. The second set of second pressing bodies 108 has a contact surface 155 for later contacting the connector body 102, but is free of protrusions. Juxtaposed to the contact surface 155 is a forming recess 157.

Figure 6:
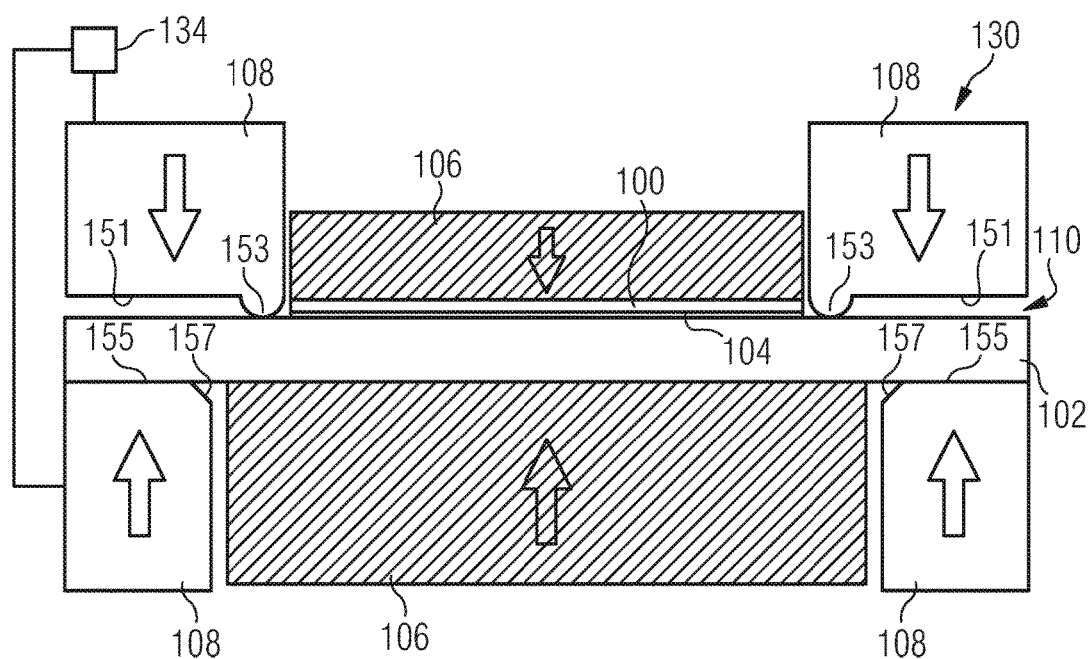

Now referring to FIG. 6, the second pressing bodies 108 have continued their motion so that the leadframe type connector body 102 is now contacted and clamped between the second pressing bodies 108.

Figure 7:
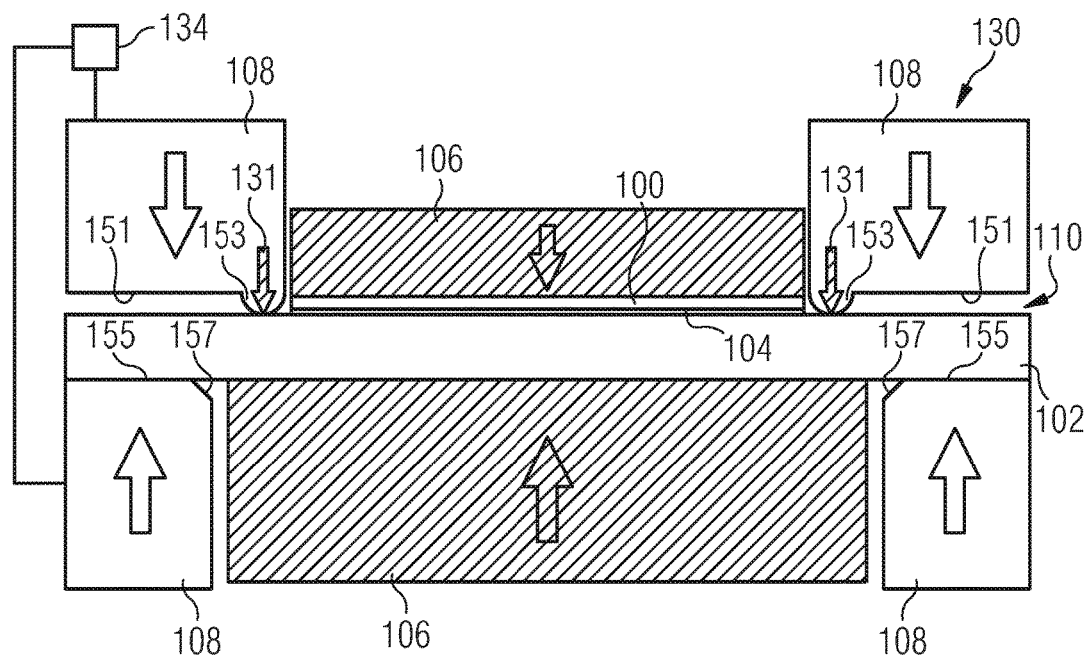

FIG. 7 illustrates that the protrusions 153 actually start to engage the connector body 102 to initiate the clamping (see arrows 131) of the connector body 102 supporting a subsequent process of forming.

Figure 8:
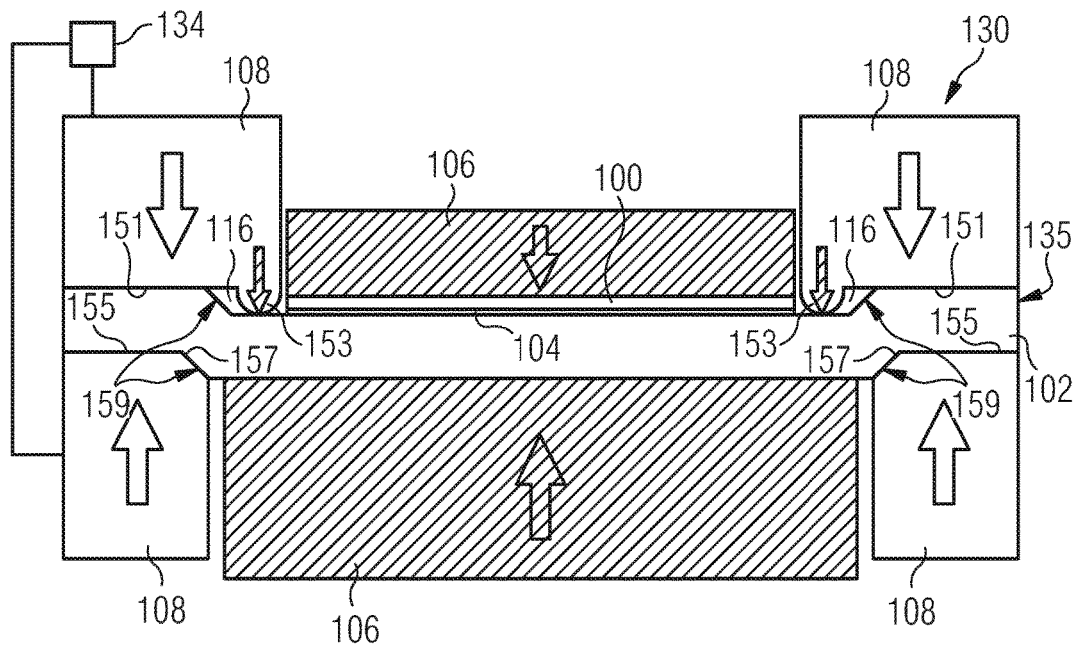

FIG. 8 shows that the forming procedure forms a can or cavity 116 in the connector body 102 by bending the latter. The interconnect structure 104 and the electronic chip 100 are thereafter located within the cavity 116 forming a can-shaped structure. FIG. 8 illustrates how the actual forming procedure of reshaping the connector body 102 is accomplished. In comparison to FIG. 7, the second claiming bodies 108 continue their motion towards the already engaged connector body 102 so that the protrusions 153 cooperate with the inclined edges of the forming recess 157 of the second pressing bodies 108 to form a step 159 of the connector body 102. More precisely, the inclined edges of the forming recess 157 of the second pressing bodies 108 in combination with their contact surface 155 define the can-shape of the re-formed connector body. This step 159 may be formed around a full circumference of the electronic chip 100 already connected to the connector body 102 by sintering. Thus, the shape of the formed connector body 102 is definable and actually defined by the surface configuration of the second pressing bodies 108. It should be said that the first pressing bodies 106 maintain their pressing force during this forming procedure. Furthermore, the pressing bodies 106, 108 still heat the shown configuration, which simplifies the reshaping procedure.

Figure 9:
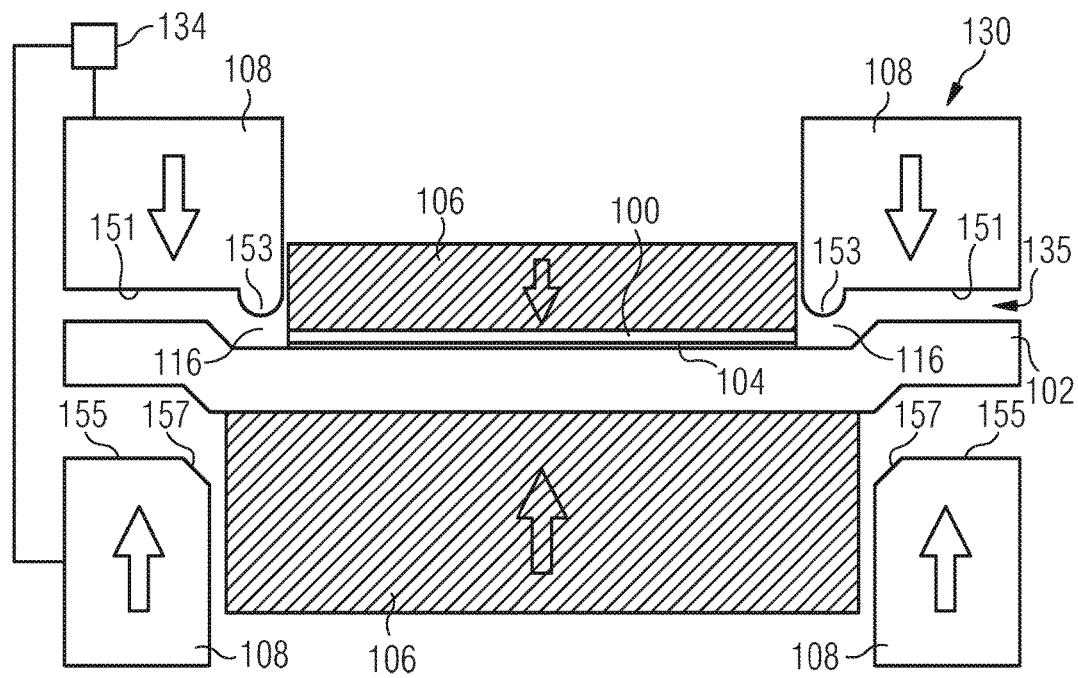

FIG. 9 shows how the clamps (i.e. the first pressing bodies 106) on the electronic chip 100 stay in place. In other words, the second pressing bodies 108 already move away from the now re-formed connector body 102, while the application of pressure and counter-pressure by the first pressing bodies 106 is still maintained.

Figure 10:
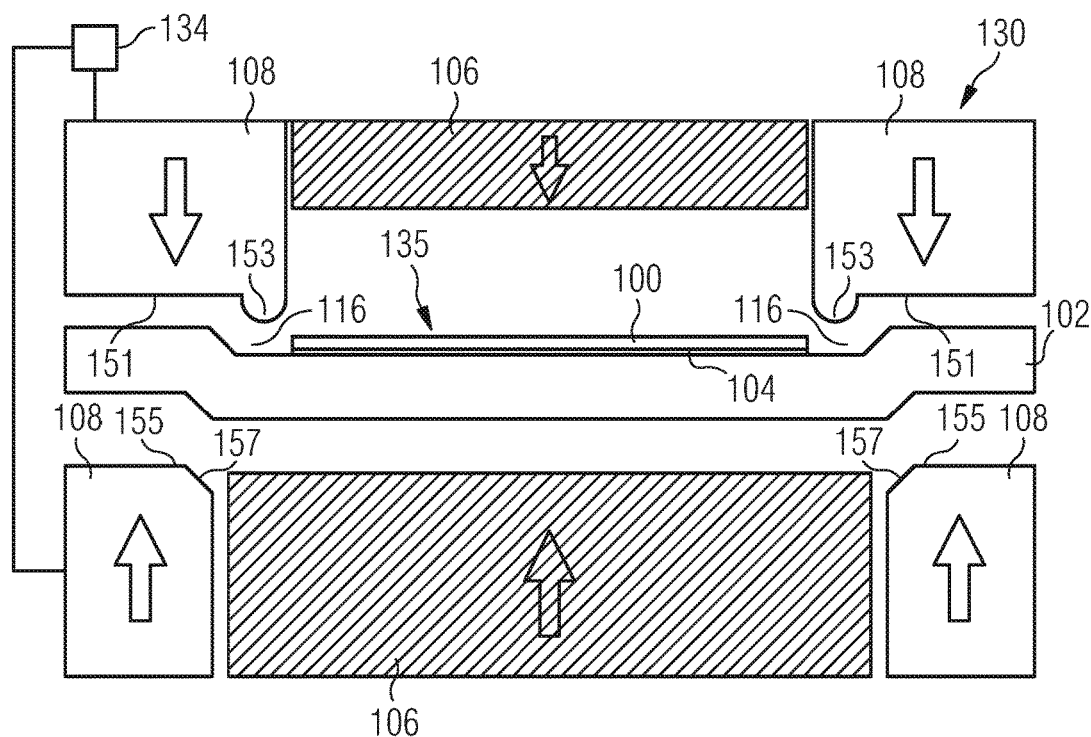

As shown in FIG. 10, the method further comprises releasing the pressure applied by the first pressing bodies 106 and by the second pressing bodies 108 after the mounting and the forming is completed, so that the electronic chip 100 is mounted on the formed connector body 102 by the interconnect structure 104. As can be taken from FIG. 10, the clamps are now removed and a frame has been formed. In other words, now also the first pressing bodies 106 are moved away from the connector body 102 so that also their clamping force or pressing force is released. The readily manufactured device 135 may be taken out of the apparatus 130.

Figure 11:
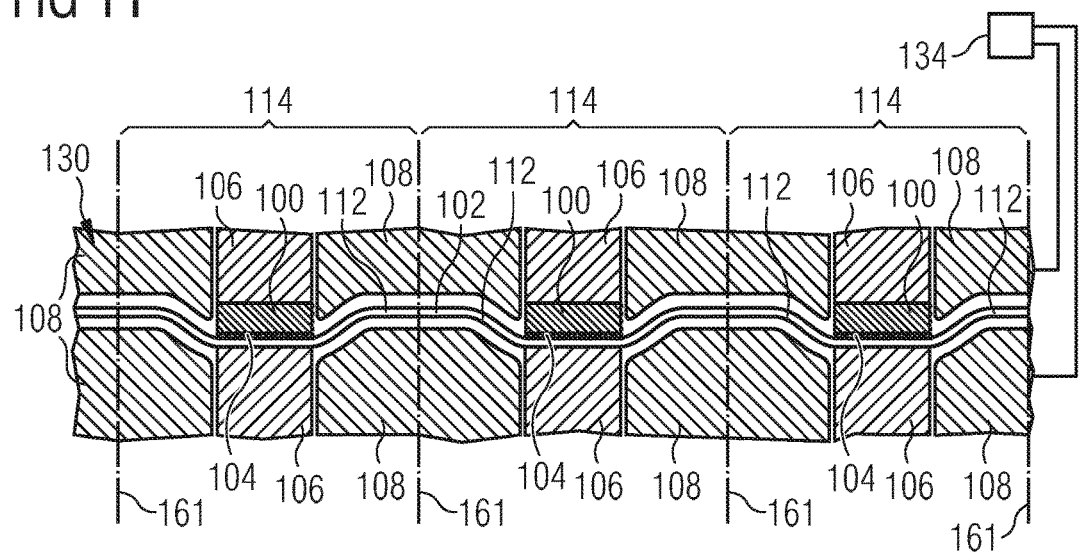
FIG. 11 show a cross-sectional views of an apparatus for processing multiple electronic chips, to be mounted using multiple interconnect structures, and a connector body, to be formed during the mounting procedure, according to an exemplary embodiment of the invention.

FIG. 11 show a cross-sectional views of an apparatus 130 for processing multiple electronic chips 100, to be mounted using multiple interconnect structures 104, and a common connector body 102, to be formed during the mounting procedure, according to an exemplary embodiment of the invention.

According to FIG. 11, a plurality of electronic chips 100 are mounted on different mounting portions 112 of the connector body 102 by different, spatially separated interconnect structures 104 by the simultaneous application of pressure to all electronic chips 100 and all mounting portions 112 of the connector body 102. After the forming and the mounting, the connector body 102 with the electronic chips 100 mounted thereon by the interconnect structures 104 can be singularized into multiple sections 114. Each section 114 comprises a portion of the connector body 102, one of the electronic chips 100 and one of the interconnect structures 104, and thereby constitutes a device 135 according to an exemplary embodiment. Thus, FIG. 11 shows a batch manufacturing process of manufacturing multiple devices 135 which are denoted as sections 114 in FIG. 11. As can be taken from FIG. 11, multiple electronic chips 100 are mounted via multiple interconnect structures 104 or multiple portions of the connector body 102. Subsequently, multiple first pressing bodies 106 clamp the respective electronic chips 100 against the respective portions of the connector body 102 with the respective interconnect structures 104 in between. Application of heat and pressure by the first pressing bodies 106 then accomplishes the formation of a sinter connection between the electronic chips 100 and the connector body 102. While the pressing force applied by the first pressing bodies 106 is maintained, second pressing bodies 108 thereafter approach and engage the connector body 102 so as to execute a desired re-shaping or re-forming procedure. At the end of the procedure, several sections 114 of the connector body 102 have been re-formed, each section 114 corresponding to a respective one of the electronic components 102.

After that, the arrangement shown in FIG. 11 may be controlled so that the pressing bodies 106, 108 are removed. Subsequently, the arrangement of the three dimensionally formed connector body 102 with the various electronic chips 100 mounted thereon via the respective interconnect structures 104 may be singularized into separate sections 114 by cutting along cutting lines 161. This cutting can be accomplished by mechanically cutting or by laser cutting. The result are separate sections 114 of electronic chips 100 mounted on corresponding portions of the connector body 102. They may be made subject to an electronic contacting procedure, for instance bond wires or bond ribbons may be formed for establishing an electronic connection between an upper main surface of the electronic chips 100 and the respective portion of the connector body 102. The obtained sections 114 may or may not be encapsulated (for instance by a mold compound). Thereby, multiple packages or modules can be formed as devices 135 with low effort.

As an alternative to the embodiment described referring to FIG. 11, the common connector body 102 can be substituted by multiple separate connector bodies 102 (not shown), each of which being a flat metal sheet being re-formed or re-shaped simultaneously in a batch process by an apparatus 130 as the one shown in FIG. 11. Such an embodiment allows to omit a singularization procedure, thereby further simplifying the manufacturing process.

Figure 12:
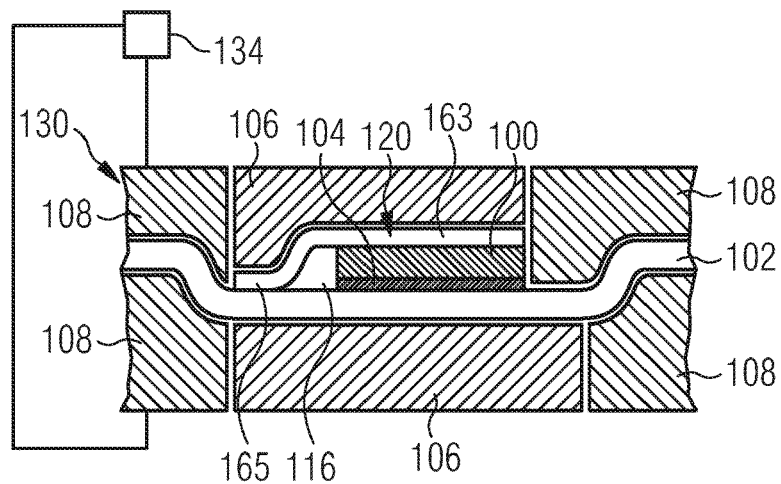
FIG. 12 show a cross-sectional views of an apparatus for processing an electronic chip, to be mounted using an interconnect structure, and a connector body, to be formed during the mounting procedure, according to an exemplary embodiment of the invention, wherein a clip is attached to the electronic chip simultaneously.

FIG. 12 show a cross-sectional views of an apparatus 130 for processing an electronic chip 100, to be mounted using an interconnect structure 104, and a connector body 102, to be formed during the mounting procedure, according to an exemplary embodiment of the invention in which a clip 120 is attached to the electronic chip 100. Thus, the forming procedure attaches the electronic chip 100 to clip 120.

FIG. 12 relates to an embodiment in which the clip 120 is connected to both the connector body 102 and the electronic chip 100 during the chip mounting and the carrier re-shaping procedure. More precisely, a chip contacting portion 163 of the clip 120 is sandwiched between an upper main surface of the electronic chip 100 and a corresponding one of the first pressing bodies 106. At the same time, a carrier contacting portion 165 of the clip 120 is attached to the connector body 102. The first pressing bodies 106 thereby also connect the clip 120 to both the electronic chip 100 and the connector body 102 without additional effort. Again, the second clamping bodies 108 contribute to the formation of a re-shaped portion of the connector body 102.

Figure 13:
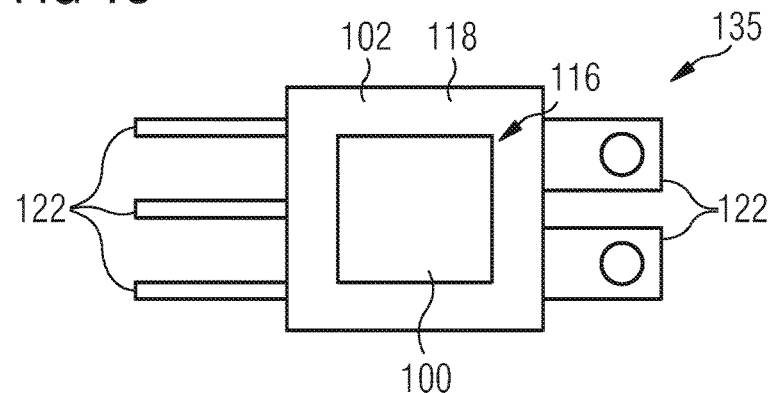
FIG. 13 illustrates a device comprising an electronic chip on a connector body manufactured according to an exemplary embodiment of the invention, wherein the electronic chip is surrounded by a frame and is connected to multiple leads.

FIG. 13 illustrates a device 135 according to an exemplary embodiment. The device 135 comprises the electronic chip 100 on the connector body 102 manufactured according to an exemplary embodiment of the invention, wherein the chip 100 is surrounded by a frame 118 and is connected to multiple leads 122. In the shown embodiment, the forming procedure forms frame 118 around the electronic chip 100 and the interconnect structure 104. Moreover, the forming procedure attaches and/or forms the leads 122 electrically contacting the electronic chip 100.

FIG. 13 shows a plan view of an embodiment in which chip 100 is placed in cavity 116 of the connector body 102 surrounded by frame 118, wherein simultaneously leads 122 are bent or reshaped. All this can be accomplished by first pressing bodies 106 cooperating with second pressing bodies 108, as described above.

Figure 14:
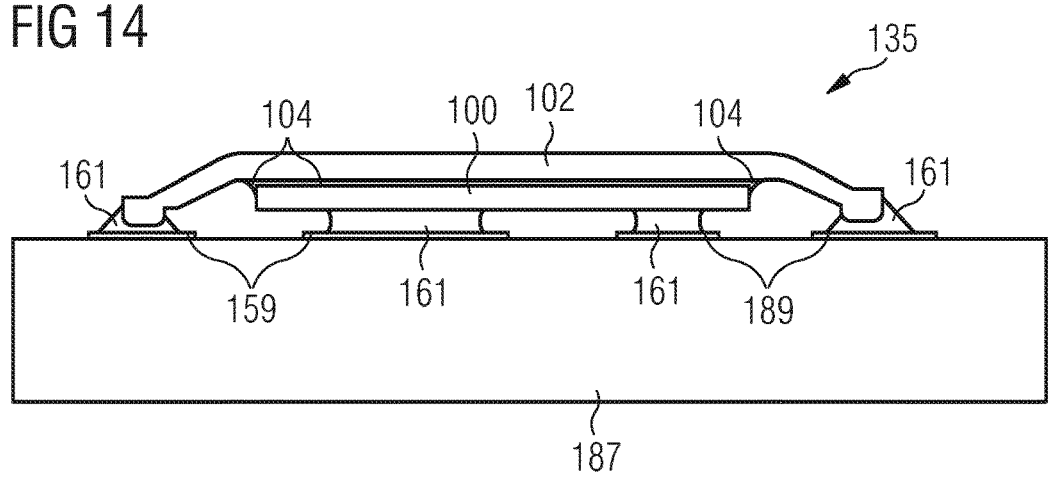
FIG. 14 illustrates a device comprising an electronic chip on a connector body manufactured according to an exemplary embodiment of the invention.

FIG. 14 illustrates a device 135 comprising an electronic chip 100, embodied as semiconductor power chip with integrated MOSFET, on a can-shaped connector body 102 manufactured according to an exemplary embodiment of the invention. The electronic chip 100 has been interconnected to the leadframe-type connector body 102 by a sinter-type interconnect structure 104 by a procedure as the one shown in FIG. 1 to FIG. 10. During this procedure, the can-shaped connector body 102 has been three-dimensionally bent by mechanical pressure supported by heat. After completion of the manufacture, the device 135 has been mounted on a mounting base 187 such as a printed circuit board (PCB). Electrically conductive tracks 189 of the mounting base 187 are mechanically and electrically connected to the electronic chip 100 and the connector body 102 by solder structures 161.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method which comprises applying a common pressing force operative:
   to interconnect an electronic chip with a connector body by an interconnect structure; and
   to contribute to a forming of the connector body,
   wherein, prior to the forming, the connector body is a planar structure,
   wherein, after the forming, the connector body is converted into a three-dimensionally bent structure.

2. The method according to claim 1, wherein the interconnect structure comprises at least one of the group consisting of a sinter material and a solder material.

3. The method according to claim 1, wherein the connector body comprises a chip carrier.

4. The method according to claim 1, wherein the connector body comprises or consists of a clip.

5. The method according to claim 1, wherein, prior to the forming, the connector body is a planar metal sheet.

6. The method according to claim 1, wherein the method comprises mounting a plurality of electronic chips on different mounting portions of the connector body by different interconnect structures by the simultaneous application of pressure to all electronic chips and all mounting portions of the connector body.

7. The method according to claim 6, wherein the method comprises, after the forming and the mounting, singularizing the connector body with the electronic chips mounted thereon by the interconnect structures into multiple sections, each section comprising a portion of the connector body, at least one of the electronic chips and at least one of the interconnect structures.

8. The method according to claim 1, wherein the method comprises mounting a plurality of electronic chips on different ones of multiple separate connector bodies by different interconnect structures by the simultaneous application of pressure to all electronic chips and all connector bodies.

9. The method according to claim 1, wherein the method comprises heating the electronic chip, the interconnect structure and the connector body to an elevated temperature above ambient temperature, in particular at least to an interconnect temperature at which the interconnect structure interconnects the electronic chip with the connector body, more particularly to a temperature of at least 200° C., during the mounting and the forming.

10. The method according to claim 1, wherein the method comprises heating the electronic chip, the interconnect structure and the connector body at least to an interconnect temperature at which the interconnect structure interconnects the electronic chip with the connector body during the mounting, and is configured for subsequently further heating the electronic chip, the interconnect structure and the connector body to a further elevated temperature for forming.

11. The method according to claim 1, wherein the method comprises applying the interconnect structure on the connector body prior to the mounting and the forming.

12. The method according to claim 1, wherein the method comprises applying pressure between the electronic chip and a mounting portion of the connector body by at least one first pressing body and, before releasing the pressure applied by the at least one first pressing body, applying pressure on a forming portion of the connector body by at least one second pressing body for forming.

13. The method according to claim 12, wherein the method comprises releasing the pressure applied by the at least one first pressing body and by the at least one second pressing body after the mounting and the forming.

14. The method according to claim 1, wherein the forming forms a cavity in the connector body in which the interconnect structure and the electronic chip are at least partially located.

15. The method according to claim 1, wherein the forming forms a frame around the electronic chip and the interconnect structure.

16. The method according to claim 1, wherein the mounting simultaneously attaches the electronic chip to a clip.

17. The method according to claim 1, wherein during the forming at least one lead electrically contacting the electronic chip is at least one of attached to the electronic chip and formed as part of the connector body.

18. An apparatus which comprises:
   a pressing unit configured to apply pressure to an electronic chip on an interconnect structure on a mounting portion of a connector body and to a forming portion of the connector body;
   a control unit configured for controlling the pressing unit to mount the electronic chip on the connector body by the interconnect structure and to form the connector body by a pressing force which is at least partly maintained during mounting and forming,
   wherein, prior to the forming, the connector body is a planar structure,
   wherein, after the forming, the connector body is converted into a three-dimensionally bent structure.

19. The apparatus according to claim 18, comprising a tempering unit configured for heating the electronic chip, the interconnect structure and the connector body at least to an interconnection temperature at which interconnection of the electronic chip and the connector body by the interconnect structure occurs, in particular at least 200° C.

20. The apparatus according to claim 19, wherein the control unit is configured for controlling the tempering unit to heat the connector body, the electronic chip and the interconnect structure to an elevated temperature above ambient temperature during mounting and forming.

21. The apparatus according to claim 18, wherein the pressing unit comprises at least one first pressing body and comprises at least one second pressing body, wherein the at least one first pressing body is configured for applying a pressing force to the electronic chip on the connector body for mounting, and wherein the at least one second pressing body is configured to apply a further pressing force to the connector body for forming before releasing the pressing force applied by the at least one first pressing body.

22. The apparatus according to claim 18, wherein the control unit is configured for controlling the apparatus to carry out a method according to claim 1.

* * * * *